United States Patent
Hu (10) Patent No.: US 10,957,879 B2
(45) Date of Patent: Mar. 23, 2021

(54) OLED SUBSTRATE, MANUFACTURING METHOD THEREOF, DISPLAY DEVICE

(71) Applicant: BOE TECHNOLOGY GROUP CO., LTD., Beijing (CN)

(72) Inventor: Chunjing Hu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/610,946

(22) PCT Filed: Apr. 1, 2019

(86) PCT No.: PCT/CN2019/080799
§ 371 (c)(1),
(2) Date: Nov. 5, 2019

(87) PCT Pub. No.: WO2019/192421
PCT Pub. Date: Oct. 10, 2019

(65) Prior Publication Data
US 2020/0075893 A1 Mar. 5, 2020

(30) Foreign Application Priority Data
Apr. 3, 2018 (CN) .......................... 201810293751.5

(51) Int. Cl.
*H01L 27/32* (2006.01)
*H01L 51/52* (2006.01)
(Continued)

(52) U.S. Cl.
CPC ........ *H01L 51/5275* (2013.01); *H01L 27/322* (2013.01); *H01L 27/3272* (2013.01);
(Continued)

(58) Field of Classification Search
CPC .............. H01L 51/5275; H01L 27/322; H01L 27/3272; H01L 51/0005; H01L 51/56;
(Continued)

(56) References Cited

U.S. PATENT DOCUMENTS 7,229,704 B2 * 6/2007 Seki ....................... H05B 33/04
313/504
7,605,535 B2 * 10/2009 Kobayashi .......... H01L 27/3211
313/112
(Continued)

FOREIGN PATENT DOCUMENTS

CN 107290894 A 10/2017
CN 107393939 A 11/2017
(Continued)

OTHER PUBLICATIONS

First Office Action for Chinese Patent Application No. 2018102937515 dated Feb. 25, 2020.

*Primary Examiner* — Jarrett J Stark
(74) *Attorney, Agent, or Firm* — Calfee, Halter & Griswold LLP (57) ABSTRACT

An OLED substrate and a manufacturing method thereof, the OLED substrate includes a substrate, and an OLED device in a sub-pixel region on the substrate. The OLED device includes an organic layer having a non-uniform thickness. The OLED substrate further includes a transmittance adjusting layer in the sub-pixel region. The transmittance of a portion of the transmittance adjusting layer corresponding to a thicker portion of the organic layer is higher than the transmittance of a portion of the transmittance adjusting layer corresponding to a thinner portion of the organic layer. The transmittance adjusting layer is located on a light exit side of the organic layer such that light emitted from the organic layer passes through the transmit-
(Continued)

tance adjusting layer when the OLED substrate is in operation.

16 Claims, 4 Drawing Sheets

(51) Int. Cl.
*H01L 51/00* (2006.01)
*H01L 51/56* (2006.01)
(52) U.S. Cl.
CPC .......... *H01L 51/0005* (2013.01); *H01L 51/56* (2013.01); *H01L 2251/533* (2013.01)
(58) Field of Classification Search
CPC .......... H01L 2251/533; H01L 51/5262; H01L 27/3246; H01L 2251/558; H01L 27/32; H01L 51/5296
See application file for complete search history.

(56) References Cited

U.S. PATENT DOCUMENTS

| | | | |
|---|---|---|---|
| 8,963,138 B2 | 2/2015 | Lim et al. | |
| 9,818,811 B2* | 11/2017 | Shin | H01L 51/5088 |
| 2004/0189194 A1* | 9/2004 | Kihara | H01L 51/5088 |
| | | | 313/506 |
| 2005/0174041 A1* | 8/2005 | Li | H01L 51/5203 |
| | | | 313/500 |
| 2007/0015429 A1* | 1/2007 | Maeda | H01L 51/5206 |
| | | | 445/24 |
| 2008/0024402 A1* | 1/2008 | Nishikawa | H05B 33/22 |
| | | | 345/82 |
| 2008/0211385 A1* | 9/2008 | Kim | H01L 51/0096 |
| | | | 313/498 |
| 2009/0015149 A1* | 1/2009 | Lee | H01L 51/5218 |
| | | | 313/504 |
| 2010/0181554 A1* | 7/2010 | Yoshida | H01L 51/5262 |
| | | | 257/40 |
| 2011/0062476 A1* | 3/2011 | Tobise | H01L 51/5275 |
| | | | 257/98 |
| 2012/0049175 A1* | 3/2012 | Ono | H01L 27/3246 |
| | | | 257/40 |
| 2014/0151651 A1* | 6/2014 | Jin | H01L 27/3248 |
| | | | 257/40 |
| 2014/0312319 A1* | 10/2014 | Kim | H01L 27/3258 |
| | | | 257/40 |
| 2015/0090989 A1 | 4/2015 | Matsumoto et al. | |
| 2015/0249120 A1* | 9/2015 | Cheng | H01L 27/3272 |
| | | | 257/40 |
| 2015/0357384 A1* | 12/2015 | Li | H01L 51/5231 |
| | | | 257/40 |
| 2016/0041317 A1* | 2/2016 | Kim | G02B 26/005 |
| | | | 359/891 |
| 2016/0056218 A1* | 2/2016 | Wang | H01L 51/0004 |
| | | | 257/40 |
| 2017/0278913 A1* | 9/2017 | Zhang | H01L 27/3258 |
| 2018/0231831 A1* | 8/2018 | Wang | G02F 1/29 |
| 2019/0006626 A1* | 1/2019 | Kim | H01L 27/322 |
| 2019/0123306 A1* | 4/2019 | Liang | H01L 51/5275 |
| 2019/0386076 A1* | 12/2019 | Chen | H01L 27/322 |
| 2020/0075893 A1 | 3/2020 | Hu | |

FOREIGN PATENT DOCUMENTS

| | | |
|---|---|---|
| CN | 107591434 A | 1/2018 |
| CN | 108400153 A | 8/2018 |

* cited by examiner

OLED SUBSTRATE, MANUFACTURING METHOD THEREOF, DISPLAY DEVICE

RELATED APPLICATION

The present application is a 35 U.S.C. 371 national stage application of a PCT International Application No. PCT/CN2019/080799, filed on Apr. 1, 2019, which claims the benefit of Chinese Patent Application No. 201810293751.5, filed on Apr. 3, 2018, the entire disclosure of which is incorporated herein by reference.

TECHNICAL FIELD

The present disclosure relates to the field of display technologies, and especially to an OLED substrate, a manufacturing method thereof, and a display device.

BACKGROUND

Organic light emitting diode (OLED) displays have advantages such as self-luminescence, fast response, wide viewing angle, high brightness, brilliant color, thinness and lightness, and the like, as compared with liquid crystal displays (LCDs).

Methods for forming an organic layer of each sub-pixel in an OLED display mainly include vacuum evaporation and the solution process. The vacuum evaporation is applicable to organic small molecular materials, which can fabricate uniform films. Vacuum evaporation is relatively mature in technique, but tends to require a large equipment investment and has drawbacks such as a low material utilization rate, and low alignment precision in case of a large-size product mask. The solution process includes spin coating, inkjet printing, nozzle coating, etc., which is applicable to polymer materials and soluble small molecular materials, and characterized by a low equipment cost. Thus, the solution process presents advantages in case of large-scale and large-size production. In particular, the inkjet printing technology used is capable of accurately injecting a solution into a sub-pixel region. However, a serious problem lies in that it is difficult for an organic solution to form an organic layer having uniform thickness in the sub-pixel region.

SUMMARY

An exemplary embodiment provides an OLED substrate, which comprises a substrate and an OLED device in a sub-pixel region on the substrate. The OLED device comprises an organic layer having a non-uniform thickness. The OLED substrate further comprises a transmittance adjusting layer in the sub-pixel region, the transmittance adjusting layer is located on a light exit side of the organic layer such that light emitted from the organic layer passes through the transmittance adjusting layer when the OLED substrate is in operation. A transmittance of a portion of the transmittance adjusting layer corresponding to a thicker portion of the organic layer is higher than a transmittance of a portion of the transmittance adjusting layer corresponding to a thinner portion of the organic layer.

In some exemplary embodiments, a middle portion of the organic layer is thicker than an edge portion of the organic layer, a middle portion of the transmittance adjusting layer is thinner than an edge portion of the transmittance adjusting layer.

In some exemplary embodiments, a middle portion of the organic layer is thinner than an edge portion of the organic layer, a middle portion of the transmittance adjusting layer is thicker than an edge portion of the transmittance adjusting layer.

In some exemplary embodiments, the transmittance adjusting layer comprises a color film layer.

In some exemplary embodiments, the OLED device is a bottom emitting OLED device.

In some exemplary embodiments, the transmittance adjusting layer is located between the substrate and the OLED device.

In some exemplary embodiments, the OLED substrate further comprises a thin film transistor in the sub-pixel region.

Another exemplary embodiment provides a display device comprising the OLED substrate according to any one of the foregoing embodiments.

Another exemplary embodiment provides a method for manufacturing an OLED substrate, comprising: forming an OLED device in a sub-pixel region on a substrate, the OLED device comprising an organic layer having a non-uniform thickness, and forming a transmittance adjusting layer in the sub-pixel region, the transmittance adjusting layer being located on a light exit side of the organic layer such that light emitted from the organic layer passes through transmittance adjusting layer when the OLED substrate is in operation. A transmittance of a portion of the transmittance adjusting layer corresponding to a thicker portion of the organic layer is higher than a transmittance of a portion of the transmittance adjusting layer corresponding to a thinner portion of the organic layer.

In some exemplary embodiments, forming the transmittance adjusting layer in the sub-pixel region comprises: forming a color film layer in the sub-pixel region.

In some exemplary embodiments, forming the color film layer comprises: forming a filter film in the sub-pixel region; and performing an exposure and development process on the filter film using a halftone mask to form the color film layer.

BRIEF DESCRIPTION OF DRAWINGS

In order to more clearly illustrate the technical solutions of embodiments of the disclosure, the drawings for exemplary embodiments will be briefly described below. The drawings in the description below are only some possible embodiments of the disclosure. Other embodiments may be obtained by a person having an ordinary skill in the art based on these drawings without inventive efforts.

DETAILED DESCRIPTION OF EMBODIMENTS

The technical solutions in exemplary embodiments will be clearly and completely described below with reference to the accompanying drawings for the embodiments herein. The described exemplary embodiments are only a part of possible embodiments of the disclosure, rather than all of them. All other embodiments obtained by a person having an ordinary skill in the art based on the exemplary embodiments herein without inventive efforts fall within the scope of the present application.

Figure 1:
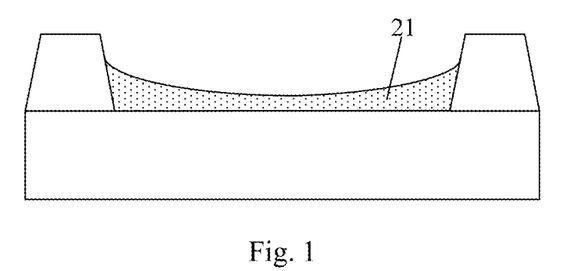
FIG. 1 and FIG. 2 illustrate that an organic layer of an OLED device fabricated by an inkjet printing process has a non-uniform thickness.
Figure 2:
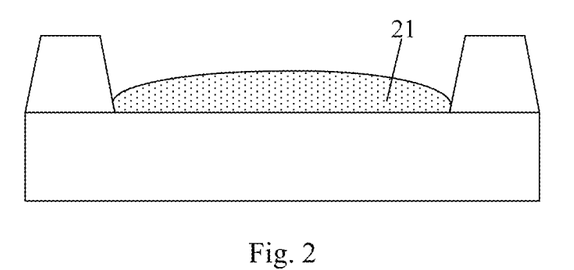
Figure 3:
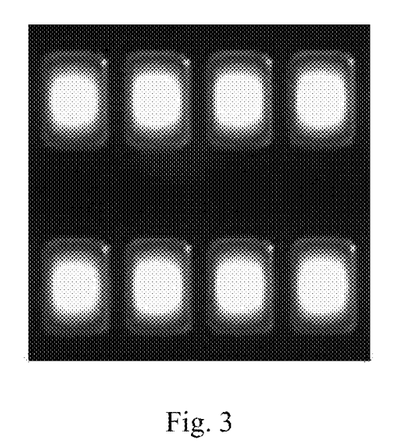
FIG. 3 illustrates the luminance when sub-pixels including the organic layer in an OLED device as shown in FIG. 1 is emitting light.

The material of a pixel defining layer (PDL) may include a lyophilic material and a lyophobic material. The inventors of the present application found that, for a lyophilic PDL, it is easy to form an organic material layer 21 having a thick edge portion and a thin middle portion in a sub-pixel region during the ink jet printing process, as shown in FIG. 1. For a lyophobic PDL, it is easy to form an organic material layer 21 having a thin edge portion and a thick middle portion in a sub-pixel when an ink jet printing process is performed, as shown in FIG. 2. An organic material layer having a non-uniform thickness may cause uneven luminance of the sub-pixel. For example, for a sub-pixel including the organic material layer 21 having a thick edge portion and a thin middle portion as shown in FIG. 1, uneven luminance as shown in FIG. 3 may occur, and the luminance of the middle portion of the sub-pixel is higher than that of the edge portion of the sub-pixel.

An OLED substrate provided by an exemplary embodiment comprises a substrate, and an OLED device in a sub-pixel region on the substrate, the OLED device comprising an organic layer having a non-uniform thickness. The OLED substrate further comprises a transmittance adjusting layer in the sub-pixel region. The transmittance adjusting layer is located on a light exit side of the organic layer, such that light emitted from the organic layer when the OLED substrate is in operation passes through the transmittance adjusting layer. A transmittance of a portion of the transmittance adjusting layer corresponding to a thicker portion of the organic layer is higher than a transmittance of a portion of the transmittance adjusting layer corresponding to a thinner portion of the organic layer.

Figure 4:
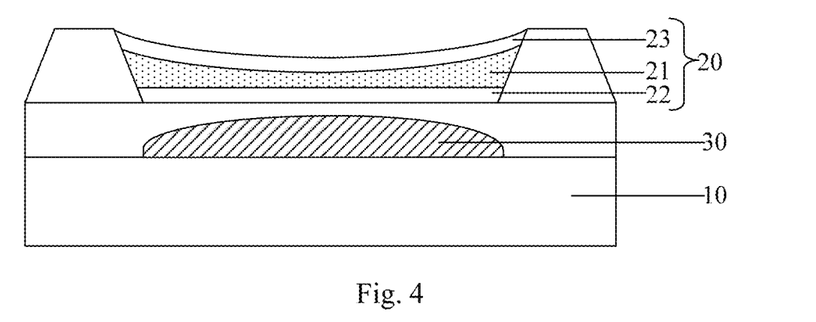
FIG. 4 is a partial sectional view of a single sub-pixel region of an OLED substrate provided by an exemplary embodiment.
Figure 5:
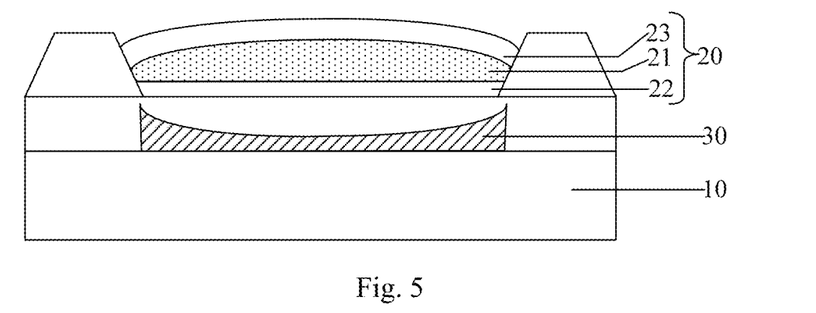
FIG. 5 is a partial sectional view of a single sub-pixel region of an OLED substrate provided by another exemplary embodiment.

FIGS. 4 and 5 illustrate two examples of partial sectional views of OLED substrates provided by exemplary embodiments, respectively. As shown in FIGS. 4 and 5, the OLED substrate comprises a substrate 10, and an OLED device 20 in a sub-pixel region on the substrate 10. The thickness of the middle portion of the organic layer 21 of the OLED device is different from the thickness of the edge portion of the OLED device. The OLED substrate further comprises a transmittance adjusting layer 30 disposed in the sub-pixel region on the substrate 10 and located on a light exit side of the organic layer 21. Different portions of the transmittance adjusting layer 30 have different light transmittances. Specifically, the transmittance of a portion of the transmittance adjusting layer 30 corresponding to a thicker portion of the organic layer 21 is higher than the transmittance of a portion of the transmittance adjusting layer 30 corresponding to a thinner portion of the organic layer 21. If the organic layer 21 of the OLED device 20 is thin in the middle portion and thick in the edge portion, the thicker portion of the organic layer 21 is the edge portion, and the thinner portion of the organic layer 21 is the middle portion. When the organic layer 21 of the OLED device 20 is thick in the middle portion and thin in the edge portion, the thicker portion of the organic layer 21 is the middle portion, and the thinner portion of the organic layer 21 is the edge portion.

For exemplary embodiments of the disclosure, in case the non-uniform thickness of the organic layer 21 of the OLED device 20 results in uneven luminance in different regions of the sub-pixel, the transmittance adjusting layer 30, whose light transmittance is designed based on the thickness of the organic layer, is advantageous for achieving uniform luminance of the sub-pixel. Specifically, in the case where the organic layer 21 of the OLED device 20 has a thin middle portion and a thick edge portion so that the luminance of the middle portion of the sub-pixel region is stronger than the luminance of the edge portion thereof, it is possible to improve the luminance uniformity of the sub-pixel by enabling a portion of the transmittance adjusting layer 30 corresponding to the middle portion of the organic layer 21 to have a relatively low transmittance, and a portion of the transmittance adjusting layer 30 corresponding to the edge portion of the organic layer 21 to have a relatively high transmittance. In the case where the organic layer 21 of the OLED device 20 has a thick middle portion and a thin edge portion so that the luminance of the middle portion of the sub-pixel region is less than the luminance of the edge portion of the sub-pixel region, it is possible to improve the luminance uniformity of the sub-pixel by enabling a portion of the transmittance adjusting layer 30 corresponding to the middle portion of the organic layer 21 to have a relatively high transmittance, and a portion of the transmittance adjusting layer 30 corresponding to the edge portion of the organic layer 21 to have a relatively low transmittance.

In some exemplary embodiments, the OLED device 20 comprises an anode 22 and a cathode 23 in addition to the organic layer 21. The organic layer 21 at least comprises a light emitting layer, and may further comprise a hole transport layer, an electron transport layer, a hole injection layer, and an electron injection layer. Additionally, for the sub-pixel region mentioned herein, it may be obtained by forming a pixel defining layer on the substrate.

The specific material of the transmittance adjusting layer 30 is not limited in the disclosure. The transmittance adjusting layer has a certain transmittance to light emitted from the organic layer of the OLED device, and those skilled in the art may adopt many appropriate ways (including but not limited to doping, thickness variation, etc.) to enable different portions of the transmittance adjusting layer to have different light transmittances.

In some exemplary embodiments, the transmittance adjusting layer 30 is formed of a single material, but it has a non-uniform thickness. The specific thickness of the transmittance adjusting layer can be determined based on the thickness variation of different regions of the organic layer. In an example in which a sub-pixel region exhibits an elliptical shape, in the long-axis direction of the sub-pixel, a region having uniform thickness in the middle of the organic layer accounts for about 80% of the length of the sub-pixel, and in the short-axis direction, a region having uniform thickness in the middle of the organic layer accounts for about 72% of the width of the sub-pixel. Accordingly, the transmittance adjusting layer 30 may be formed according to the size of the organic layer 21, such that a portion of the transmittance adjusting layer 30 having uniform thickness corresponds to the region of the organic layer having uniform thickness.

FIGS. 4 and 5 illustrate examples in which the OLED device 20 is a bottom emitting device, in which case the transmittance adjusting layer is located on a side of the organic layer facing the substrate 10, the anode 22 is a transparent anode which is close to the substrate 10, and the cathode 23 is opaque, which is away from the substrate 10, but embodiments of the disclosure are not so limited. If the OLED device 20 is a top emitting device, the transmittance adjusting layer 30 is disposed on a side of the organic layer 21 away from the substrate 10. However, no matter which side of the organic layer 21 the transmittance adjusting layer 30 is disposed on, the transmittances of different regions of the transmittance adjusting layer 30 are related to the thickness variation of different regions of the organic layer 21. In addition, FIGS. 4 and 5 only illustrate partial sectional views of one sub-pixel, and other sub-pixels of the OLED substrate may have the same structure as the sub-pixel.

In some exemplary embodiments, as shown in FIG. 4, the organic layer 21 is thin in the middle portion and thick in the edge portion. In this case, when the organic layer emits light, the luminance of the middle portion is higher than that of the edge portion. Therefore, as shown in FIG. 4, the transmittance adjusting layer 30 has a thick middle portion and a thin edge portion, so that the light transmittance of the middle portion of the transmittance adjusting layer 30 is lower than the light transmittance of the edge portion of the transmittance adjusting layer 30, thereby compensating for uneven luminance resulting from the non-uniform thickness of the organic layer.

Alternatively, in another exemplary embodiment, as shown in FIG. 5, the organic layer 21 has a thick middle portion and a thin edge portion. Correspondingly, the transmittance adjusting layer 30 has a thin middle portion and a thick edge portion, so that the light transmittance of the middle portion of the transmittance adjusting layer 30 is higher than the light transmittance of the edge portion of the transmittance adjusting layer 30, thereby compensating for uneven luminance resulting from the non-uniform thickness of the organic layer.

According to some exemplary embodiments, the transmittance adjusting layer 30 comprises a color film layer. A single pixel region of the OLED substrate may include a first sub-pixel region, a second sub-pixel region, and a third sub-pixel region, and these different sub-pixel regions may correspond to different OLED devices. According to some exemplary embodiments, the luminescent material in the organic layer in the first sub-pixel region is a red light emitting material, the luminescent material in the organic layer in the second sub-pixel region is a green light emitting material, and the luminescent material in the organic layer in the third sub-pixel region is a blue light emitting material. Correspondingly, the color film layer may include a red filter layer, a green filter layer, and a blue filter layer, which correspond to the first sub-pixel region, the second sub-pixel region, and the third sub-pixel region, respectively. In other exemplary embodiments, the material of the luminescent layer in the organic layer in the OLED device may be a white light emitting material. In this case, different color film layers may be arranged for different sub-pixel regions to realize sub-pixel regions emitting light of different colors. For example, a first sub-pixel region that emits red light, a second sub-pixel that emits green light, and a third sub-pixel region that emits blue light are realized by different color film layers.

In an exemplary embodiment, for each sub-pixel region, the thickness of the color film layer may be designed according to the thickness variation of the organic light emitting layer. For example, in case the middle portion of the organic layer of the OLED device is thicker, a corresponding middle portion of the color film layer may be formed to be thinner relative to the edge portion of the color film layer, so that the middle portion of the color film layer has a higher transmittance, thereby improving the luminance uniformity in the middle portion and the edge portion of the sub-pixel region.

Figure 6:
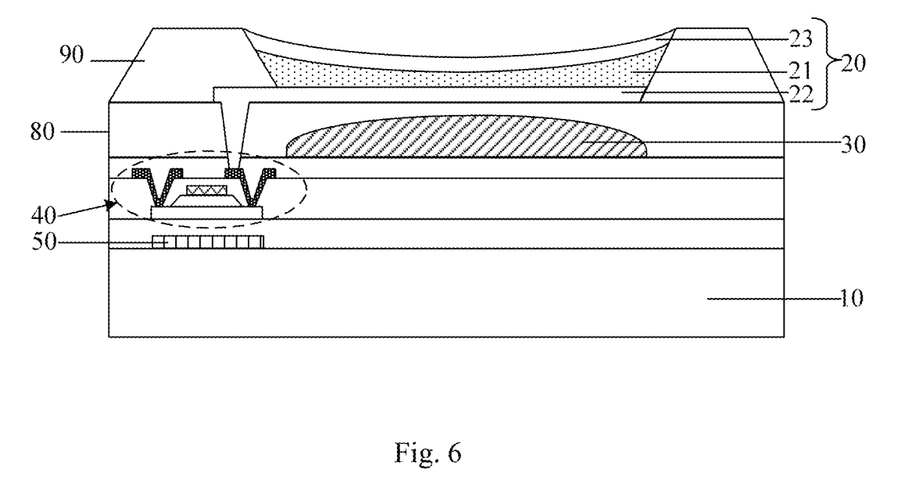
FIG. 6 is a partial sectional view of a single sub-pixel region of an OLED substrate provided by a further exemplary embodiment.
Figure 7:
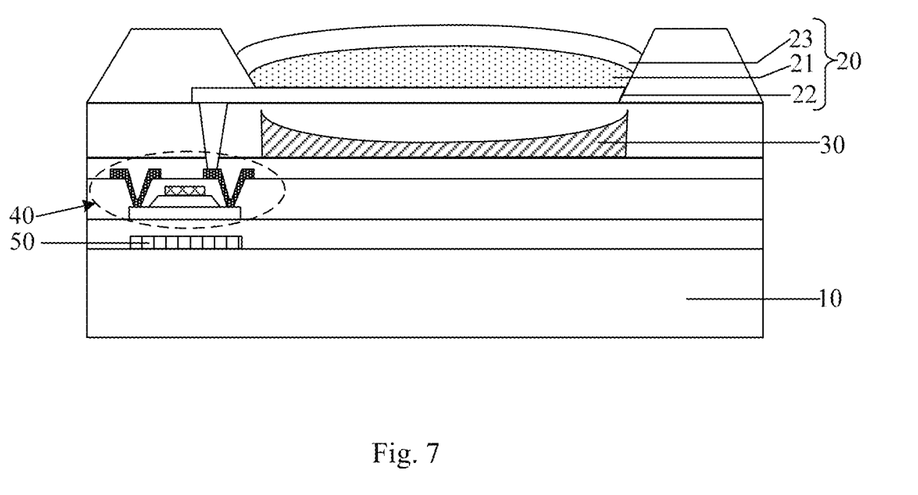
FIG. 7 is a partial sectional view of a single sub-pixel region of an OLED substrate provided by yet another exemplary embodiment.

According to further exemplary embodiments, as shown in FIGS. 6 and 7, the OLED substrate further comprises a thin film transistor 40 in a sub-pixel region on the substrate 10. The thin film transistor 40 may be electrically connected to the cathode or anode of the OLED device to drive and control the OLED device.

The thin film transistor 40 may be a polysilicon thin film transistor, an oxide thin film transistor, an organic thin film transistor, or the like. Of course, it may also be an amorphous silicon thin film transistor.

FIGS. 6 and 7 illustrate schematic example views of the OLED substrate, in which the thin film transistor is a polysilicon thin film transistor. The OLED substrate further comprises a light shielding layer 50 between the polysilicon thin film transistor and the substrate 10. The light shielding layer 50 may prevent light below the thin film transistor 40 from being irradiated to the thin film transistor.

Another exemplary embodiment further provides a display device comprising the OLED substrate described above. The display device has the same technical effects as the OLED substrate, which will not be repeated herein.

An exemplary embodiment further provides a method for manufacturing an OLED substrate, which may comprise the following steps: forming an OLED device in a sub-pixel region on a substrate, the OLED device comprising an organic layer having a non-uniform thickness; forming a transmittance adjusting layer in the sub-pixel region, the transmittance adjusting layer being located on a light exit side of the organic layer, such that light emitted from the organic layer when the OLED substrate is in operation passes through the transmittance adjusting layer, the transmittance of a portion of the transmittance adjusting layer corresponding to a thicker portion of the organic layer is higher than the transmittance of a portion of the transmittance adjusting layer corresponding to a thinner portion of the organic layer.

As shown in FIGS. 4 and 5, an OLED device 20 is formed in a sub-pixel region on a substrate 10, and an organic layer 21 of the OLED device 20 is formed e.g. by an inkjet printing process, which generally results in that, the organic layer has a non-uniform thickness, for example, the thickness of the middle portion of the organic layer 21 is different from the thickness of the edge portion of the organic layer.

Specifically, in the case where the organic layer 21 of the OLED device 20 has a thin middle portion and a thick edge portion, so that the luminance of the middle portion of the sub-pixel region is greater than the luminance of the edge portion of the sub-pixel region, it is possible to facilitate the luminance uniformity of the sub-pixel by fabricating a transmittance adjusting layer 30, a portion of the transmittance adjusting layer 30 corresponding to the middle portion of the organic layer 21 has a relatively low transmittance, and a portion of the transmittance adjusting layer 30 corresponding to the edge portion of the organic layer 21 has a relatively high transmittance.

In the case where the organic layer 21 of the OLED device 20 has a thick middle portion and a thin edge portion, so that the luminance of the middle portion of the sub-pixel region is less than the luminance of the edge portion of the sub-pixel region, it is possible to improve the luminance uniformity of the sub-pixel by forming a transmittance adjusting layer 30, a portion of the transmittance adjusting layer 30 corresponding to the middle portion of the organic layer 21 has a relatively high transmittance, and a portion of the transmittance adjusting layer corresponding to the edge portion of the organic layer 21 has a relatively low transmittance.

For the method for manufacturing an OLED substrate provided by exemplary embodiments, by forming the transmittance adjusting layer 30, a portion of which corresponding to the thicker portion of the organic layer 21 has a higher transmittance, and a portion of which corresponding to the thinner portion of the organic layer 21 has a lower luminance, the luminance uniformity of the sub-pixel can be improved.

As previously mentioned, in some exemplary embodiments, the transmittance adjusting layer 30 is a color film layer. A single pixel region of the OLED substrate may include a first sub-pixel region, a second sub-pixel region, and a third sub-pixel region, that is, the first, second, and third sub-pixels collectively constitute one pixel. In this case, the luminescent material in the organic layer in the first sub-pixel region may be a red light emitting material, the luminescent material in the organic layer in the second sub-pixel region may be a green light emitting material, and the luminescent material in the organic layer in the third sub-pixel region may be a blue light emitting material.

In further exemplary embodiments, the material of the luminescent layer may be a white light emitting material. The color film layer may include a red filter layer, a green filter layer, and a blue filter layer, which correspond to different sub-pixel regions, respectively. For example, the red filter layer is arranged in the first sub-pixel region, the green filter layer is arranged in the second sub-pixel region, and the blue filter layer is arranged in the third sub-pixel region. In some embodiments, the transmittance adjusting layer 30 may be formed via an exposure, development process using a halftone mask.

Hereinafter, a method for manufacturing an OLED substrate will be described by way of a specific example, which may comprise the following steps.

Figure 8A:
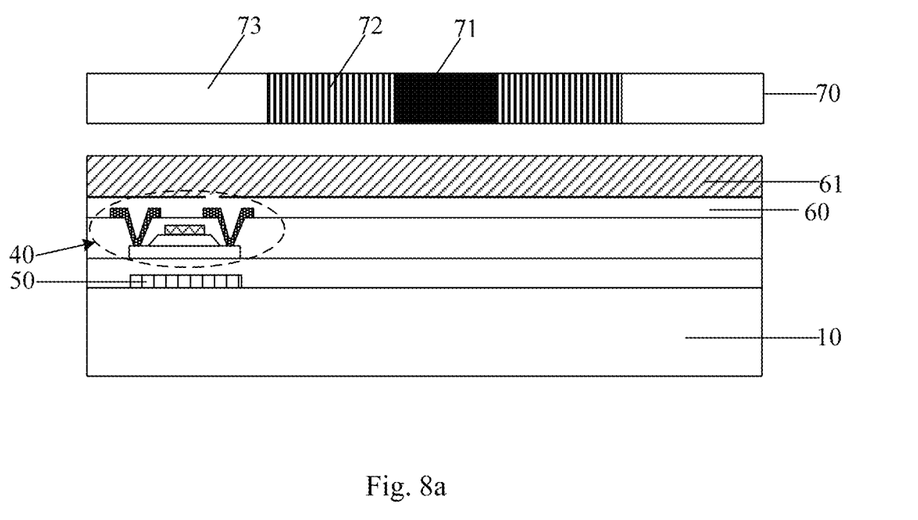
FIGS. 8a-8b illustrate a process of fabricating a transmittance adjusting layer in a single sub-pixel region provided by an exemplary embodiment.

S10, as shown in FIG. 8a, cleaning a substrate 10, and forming a light shielding layer 50, an insulating layer, and a polysilicon thin film transistor successively in respective sub-pixel regions on the substrate 10. The light shielding layer 50, the insulating layer, and the polysilicon thin film transistor are all formed by any process known to those skilled in the art.

S11, as shown in FIG. 8a, forming a first planarization layer 60 by spin coating.

S12, forming, on the first planarization layer 60, a transmittance adjusting layer 30 by an exposure, development process using a halftone mask.

In the case where the transmittance adjusting layer 30 is in a form of a color film layer, the color film layer may include a red filter layer, a green filter layer, and a blue filter layer, the red filter layer, the green filter layer, and the blue filter layer need to be formed separately.

Figure 8B:
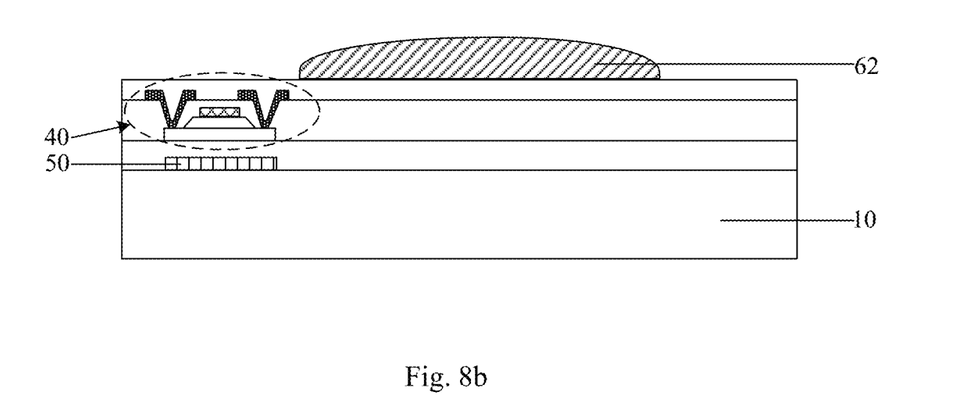

During the process of forming the red filter layer, as shown in FIG. 8a, a red filter film 61 is first formed by spin coating, and the red filter film 61 is exposed using a halftone mask 70. The halftone mask 70 includes a non-exposure region 71, a half-exposure region 72 and a full-exposure region 73. The non-exposure region 71 corresponds to a thicker portion of the red filter layer that is to be formed, the half-exposure region 72 corresponds to a thinner portion of the red filter layer that is to be formed, and the full-exposure region 73 corresponds to other regions (which will not include a red filter material). A red filter layer 62 as shown in FIG. 8b is formed after a development process.

According to an exemplary embodiment, prior to exposing the red filter film 61 using the halftone mask 70, the red filter film 61 may be baked, and after development, the resulting red filter layer 62 may be baked again.

The processes of forming the green filter layer and the blue filter layer in other sub-pixel regions are similar, and will not be described herein.

S13, referring to FIG. 6, forming a second planarization layer 80 by spin coating.

S14, referring to FIG. 6, forming an anode 22 and a pixel defining layer 90 on the second planarization layer 80. In the embodiment of FIG. 6, the material of the pixel defining layer 90 has lyophilic property.

S15, referring to FIG. 6, forming an organic layer 21 including a hole transport layer, a light emitting layer, and an electron transport layer by inkjet printing and an evaporation process successively. The hole transport layer and the light emitting layer may be fabricated by inkjet printing, and the electron transport layer may be formed by an evaporation process. Since the material of the pixel defining layer 90 is lyophilic, the organic layer 21 has a thick edge portion and a thin middle portion.

S16, referring to FIG. 6, forming a cathode 23 by an evaporation process.

What have been described above are merely specific embodiments of the disclosure, but the scope of the application is not so limited. Any variations or substitutions that can be readily conceived by a skilled person familiar with this technical field within the technical scope revealed by the disclosure should be encompassed within the scope of the application. Thus, the scope of the application should be subjected to the appended claims.

The invention claimed is:

1. An OLED substrate comprising:
   a substrate comprising a plurality of sub-pixel regions; and
   an OLED device in each sub-pixel region of the plurality of sub-pixel regions on the substrate, the OLED device in each sub-pixel region comprising an organic layer having a non-uniform thickness,
   wherein the OLED substrate further comprises a transmittance adjusting layer in each sub-pixel region of the plurality of sub-pixel regions, wherein the transmittance adjusting layer comprises a color film layer located on a light exit side of the organic layer such that light emitted from the organic layer passes through the color film layer when the OLED substrate is in operation,
   wherein a transmittance of a portion of the color film layer corresponding to a thicker portion of the organic layer is higher than a transmittance of a portion of the color film layer corresponding to a thinner portion of the organic layer.

2. The OLED substrate according to claim 1, wherein a middle portion of the organic layer is thicker than an edge portion of the organic layer, a middle portion of the color film layer is thinner than an edge portion of the color film layer.

3. The OLED substrate according to claim 1, wherein a middle portion of the organic layer is thinner than an edge portion of the organic layer, a middle portion of the color film layer is thicker than an edge portion of the color film layer.

4. The OLED substrate according to claim 1, wherein the OLED device is a bottom emitting OLED device.

5. The OLED substrate according to claim 4, wherein the transmittance adjusting layer is located between the substrate and the OLED device.

6. The OLED substrate according to claim 1, further comprising a thin film transistor in the sub-pixel region.

7. A display device comprising the OLED substrate according to claim 1.

8. A method for manufacturing the OLED substrate according to claim 1, comprising:
- providing the substrate, the substrate comprising the plurality of sub-pixel regions;
- forming the OLED device in each sub-pixel region of the plurality of sub-pixel regions on the substrate, and
- forming the color film layer in the sub-pixel region, the color film layer being located on the light exit side of the organic layer such that light emitted from the organic layer passes through color film layer when the OLED substrate is in operation.

9. The manufacturing method according to claim 8, wherein a middle portion of the organic layer is thicker than an edge portion of the organic layer, a middle portion of the color film layer is thinner than an edge portion of the color film layer.

10. The manufacturing method according to claim 8, wherein a middle portion of the organic layer is thinner than an edge portion of the organic layer, a middle portion of the color film layer is thicker than an edge portion of the color film layer.

11. The manufacturing method according to claim 8, wherein forming the color film layer comprises:
- forming a filter film in the sub-pixel region;
- performing an exposure and development process on the filter film using a halftone mask to form the color film layer.

12. The display device according to claim 7, wherein a middle portion of the organic layer is thicker than an edge portion of the organic layer, a middle portion of the color film layer is thinner than an edge portion of the color film layer.

13. The display device according to claim 7, wherein a middle portion of the organic layer is thinner than an edge portion of the organic layer, a middle portion of the color film layer is thicker than an edge portion of the color film layer.

14. The display device according to claim 7, wherein the OLED device is a bottom emitting OLED device.

15. The display device according to claim 14, wherein the transmittance adjusting layer is located between the substrate and the OLED device.

16. The display device according to claim 7, further comprising a thin film transistor in the sub-pixel region.

* * * * *